United States Patent
Breen (10) Patent No.: US 11,669,401 B2
(45) Date of Patent: Jun. 6, 2023

(54) STATUS REGISTER POWER INTERRUPTION PROTECTION

(71) Applicant: Micron Technology, Inc., Boise, ID (US)

(72) Inventor: Samuel Thomas Breen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 167 days.

(21) Appl. No.: 17/005,940

(22) Filed: Aug. 28, 2020

(65) Prior Publication Data

US 2022/0066880 A1 Mar. 3, 2022

(51) Int. Cl.
*G06F 11/00* (2006.01)
*G06F 11/14* (2006.01)
*G06F 11/07* (2006.01)
*G06F 9/30* (2018.01)

(52) U.S. Cl.
CPC ...... *G06F 11/1441* (2013.01); *G06F 9/30101* (2013.01); *G06F 11/0772* (2013.01); *G06F 11/1417* (2013.01); *G06F 2212/7211* (2013.01)

(58) Field of Classification Search
CPC ............. G06F 11/1441; G06F 11/1417; G06F 11/0772; G06F 11/1446; G06F 11/1471; G06F 11/10; G06F 2212/7211
See application file for complete search history.

(56) References Cited

U.S. PATENT DOCUMENTS

| | | | |
|---|---|---|---|
| 7,366,950 B2 * | 4/2008 | Itoh | G06F 11/1441 714/24 |
| 10,078,565 B1 * | 9/2018 | Petersson | G06F 11/181 |
| 2007/0124552 A1 * | 5/2007 | Chen | G06F 11/1441 711/162 |

FOREIGN PATENT DOCUMENTS

CN 114116301 3/2022

OTHER PUBLICATIONS

"Chinese Application Serial No. 202110996312.2, Notification to Make Rectification mailed Sep. 24, 2021", with machine English translation, 3 pages.
"Chinese Application Serial No. 202110996312.2, Response filed Nov. 15, 2021 to Notification to Make Rectification mailed Sep. 24, 2021", with English claims, 101 pages.

* cited by examiner

*Primary Examiner* — Joseph D Manoskey
(74) *Attorney, Agent, or Firm* — Schwegman Lundberg & Woessner, P.A.

(57) ABSTRACT

Techniques are provided for improved restart of a system. In an example, a system can alternate storing a status register value or state to two or more non-volatile memory locations. Upon a power interruption and restart, the value of the status register can be restored to a state very close to or commensurate with a last occurring state even if a write operation to one of the non-volatile memory locations resulted an inaccurate saving of that state of the status register.

19 Claims, 5 Drawing Sheets

STATUS REGISTER POWER INTERRUPTION PROTECTION

TECHNICAL FIELD

Embodiments described herein generally relate to systems and methods for improving system restart after a unexpected power interruption.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), in various forms, such as static RAM (SRAM), dynamic random-access memory (DRAM) or synchronous dynamic random-access memory (SDRAM), among others. Non-volatile memory may retain stored data when not powered (may be implemented as read-only memory (ROM) in some cases), and may include one or more storage technologies, such as flash memory (e.g., NAND or NOR flash), electrically erasable programmable ROM (EEPROM), Ferroelectric RAM (FeRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate, or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Reducing the amount of time a system needs to startup from a power-down event can provide a significant advantage over competitors. Some delays between re-establishing power from a power interruption and providing desired functionality of system can be attributed to some parts of the system retrieving or evaluating a last state of the system and preparing the system for functionality in light of the last known state.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Memory devices include individual memory die, which may, for example, include a storage region comprising one or more arrays of memory cells implementing one (or more) selected storage technologies. Such a memory die will often include support circuitry for operating the memory array(s). Other examples, sometimes known generally as "managed memory devices," include assemblies of one or more memory die associated with memory controller functionality configured to control operation of the one or more memory die. Such memory controller functionality may simplify interoperability with an external device, such as a "host" as discussed later herein, and further facilitate management of (typically) multiple discrete memory devices. In such managed memory devices, the controller functionality may be implemented on one or more die also incorporating a memory array or on a separate die. In other memory devices, one or more memory devices may be combined with memory controller functionality to form a solid-state drive (SSD) storage volume.

Example embodiments of the present disclosure are described in the examples of non-volatile memory devices such as flash memory devices (in either NAND or NOR configurations) or ferroelectric RAM (FeRAM); and also in assemblies, such as managed memory devices implementing NAND flash memory cells (termed "managed NAND" devices) or SSDs, both as discussed above. These examples, however, are not limiting on the scope of the disclosure, which may be implemented with memory devices implementing other memory storage technologies, such as the non-limiting examples previously discussed herein. Managed memory devices may be used as primary or ancillary memory in various forms of electronic devices and are commonly used in mobile devices. FeRAM may use similar device architectures as DRAM but may have non-volatile properties due to the use of a ferroelectric capacitor as a storage device. In some applications, FeRAM devices may have more flexible performance compared to other non-volatile and volatile memory devices.

Some non-volatile architecture semiconductor memory arrays may be programmed to two or more programmed states. For example, a single-level cell (SLC) may represent one of two programmed states (e.g., 1 or 0), representing one bit of data. Flash memory cells may also represent more than two programmed states, allowing the manufacture of higher density memories without increasing the number of memory cells, as each cell may represent more than one binary digit (e.g., more than one bit). Such cells may be referred to as multi-state memory cells, multi-digit cells, or multi-level cells (MLCs). In certain examples, MLC may refer to a memory cell that may store two bits of data per cell (e.g., one of four programmed states), TLC may refer to a memory cell that may store three bits of data per cell (e.g., one of eight programmed states), and a QLC may store four bits of data per cell. MLC is used herein in its broader context, to refer to any memory cell(s) that may store more than one bit of data per cell (i.e., that may represent more than two programmed states; thus, the term MLC is used herein in the broader context, to be generic to memory cells storing 2, 3, 4, or more bits of data per cell).

Various non-volatile memory devices may be configured and operated in accordance with recognized industry standards. For example, managed NAND devices may be (as non-limiting examples), a Universal Flash Storage (UFS™) device, an embedded MMC device (eMMC™), etc. For example, in the case of the above examples, UFS devices may be configured in accordance with Joint Electron Device Engineering Council (JEDEC) standards (e.g., JEDEC standard JESD223D, entitled "JEDEC UFS Flash Storage 3.0," and/or updates or subsequent versions to such standard). Similarly, identified eMMC devices may be configured in accordance with JEDEC standard JESD84-A51, entitled "JEDEC eMMC standard 5.1," and/or updates or subsequent versions to such standard. The identified standards are provided only as example environments in which the described methods and structures may be utilized, but such methods and structures may be utilized in a variety of environments outside of the identified standards (or of any other actual or proposed standards), except as expressly indicated herein.

An SSD may be used as, among other things, the main storage device of a computer; and offer advantages over traditional hard drives with moving parts with respect to, for example, performance, size, weight, ruggedness, operating temperature range, and power consumption. For example, SSDs may have reduced seek time, latency, or other delays relative to conventional magnetic disk drives. SSDs use non-volatile memory cells, such as flash memory cells, thus allowing the drive to be more versatile and compact.

Both SSDs and managed memory devices may include a number of memory devices, including a number of dies or logical units (e.g., logical unit numbers or LUNs), and typically include a memory controller, including processing circuitry, which will often include one or more processors, performing logic functions to operate the memory devices or interface with external systems. Such SSDs and managed memory devices may include one or more flash memory die, including a number of memory arrays and peripheral circuitry thereon. The flash memory arrays may include a number of blocks of memory cells organized into a number of physical pages or chunks. In some examples, the SSDs may also include DRAM or SRAM (or other forms of memory die or other memory structures), for example as part of a controller. Similarly, managed NAND devices may include one or more arrays of volatile and/or nonvolatile memory separate from the NAND storage array and either within or separate from a controller. Both SSDs and managed NAND devices may receive commands from a host in association with memory operations, such as read or write operations to transfer data (e.g., user data and associated integrity data, such as error data and address data, etc.) between the memory devices and the host, or erase operations to erase data from one or more memory devices.

Figure 1:
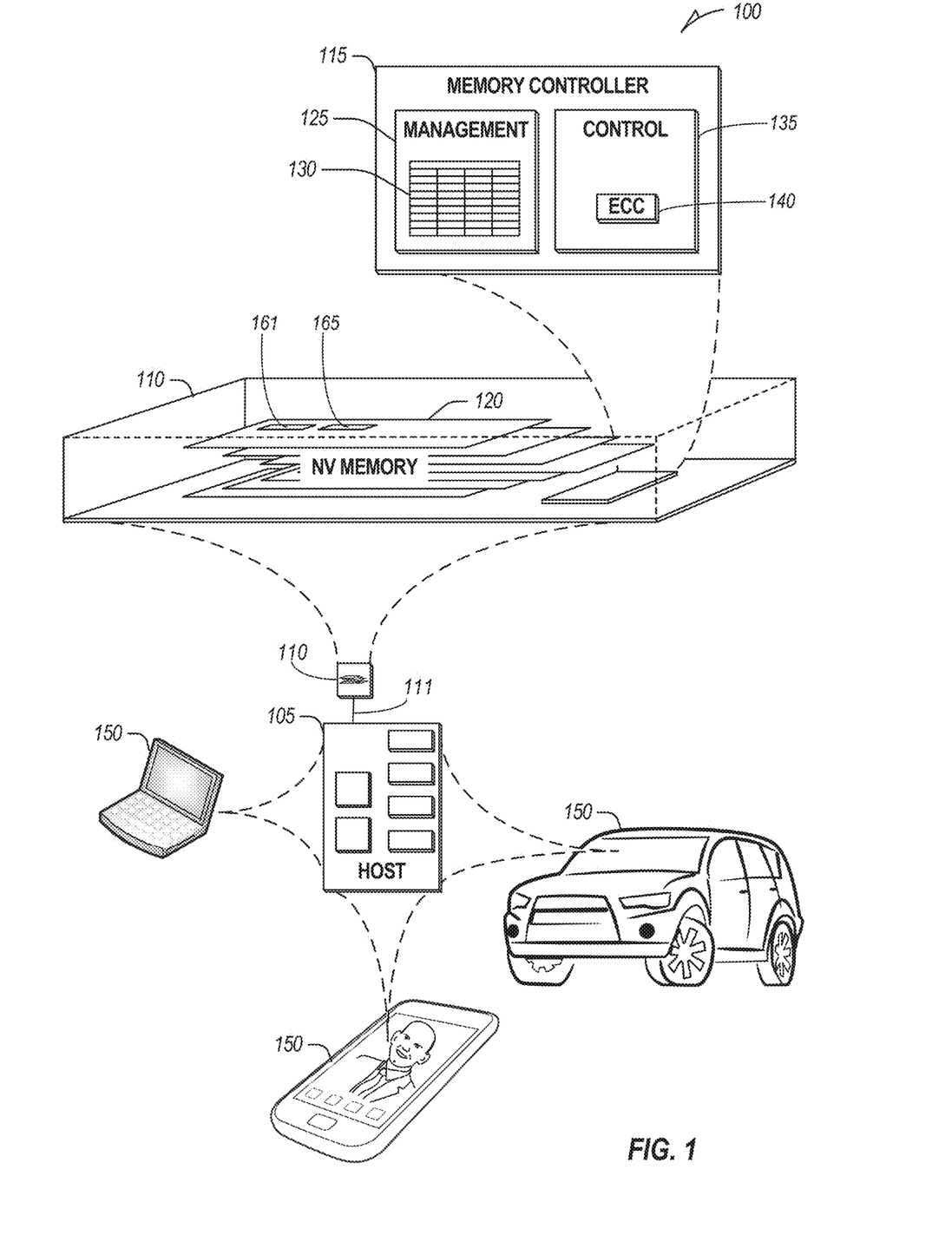
FIG. 1 illustrates an example of an environment 100 including a host device 105 and a memory device 110 configured to communicate over a communication interface 111.

FIG. 1 illustrates an example of an environment 100 including a host device 105 and a memory device 110 configured to communicate over a communication interface 111. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of 3D NAND die). In an example, the memory device 110 may be a discrete memory or storage device component of the host device 105. In other examples, the memory device 110 may be a portion of an integrated circuit (e.g., system on a chip (SOC), etc.), stacked or otherwise included with one or more other components of the host device 105. Each memory die may include a local controller 165 for controlling operations on the memory die. Such a local controller 165 may include processing circuitry, potentially including processor(s), for controlling the die, which may include implementing the power loss protection functionality described herein. In other examples, the power loss protection functionality may be implemented in memory controller 115.

In the described examples, the memory device 110 communicates with host device 105 components via communication interface 111. Thus, as described herein, a host, or host device 105 operation is distinct from those of the memory device 110, even when the memory device 110 is integrated into the host device 105.

Various forms of communication interfaces may be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 may include a host system, an electronic device, a processor, a memory card reader, or one or more other electronic devices external to the memory device 110. In some examples, the host 105 may be a machine having some portion, or all, of the components discussed in reference to the machine 1100 of FIG. 11.

The memory controller 115 may receive instructions from the host 105, and may communicate with the memory array 120, such as to transfer data to (e.g., write) or from (e.g., read), or to erase one or more of the memory cells, planes, sub-blocks, blocks, or pages of the memory array 120. For example, the memory controller 115 includes processing circuitry, which may include one or more processors which, when present, operate to execute instructions stored in the memory device. For purposes of the present examples, the instructions will be discussed as firmware, though instructions may also be present as software; and all or some portion of the described functions may also be implemented in circuitry including one or more components or integrated circuits.

For example, the memory controller 115 may include one or more memory control units, circuits, or components configured to control access across the memory array 120 and to provide a translation layer between the host 105 and the memory device 110. Additionally, the memory controller may include a memory interface to interface with the associated memory devices. In some examples, the memory interface may an Open NAND Flash Interface (ONFI). Although the memory controller 115 is here illustrated as part of the memory device 110 package, other configurations may be employed, such as the memory controller 115 being a component of the host 105 (e.g., as a discrete package on a system-on-a-chip of the host 105 that is separate from the memory device 110), or even implemented via a central processing unit (CPU) of the host 105.

The memory manager 125 may include, among other things, multiple components or integrated circuits and/or instructions for execution, associated with various memory management functions. In some embodiments, the functions of the memory manager 125 are implemented by a controller (or processor) executing the instructions of firmware which in some examples would be stored within the memory controller 115. In other examples, memory manager 125 can be implemented at least in part by one or more processors within memory controller 115, which may execute instructions stored in the memory array 120. Similarly, the management tables 130, such as mapping tables or logical block to physical address (L2P) tables can be stored on the memory controller 115 or in memory array 120. In such examples the instructions and/or management tables 130 may be stored in certain blocks of the non-volatile memory die stack and loaded into the working memory of memory controller 115 during operation.

For purposes of the present description, example memory operation and management functions may be described in the context of a particular form of memory architecture (e.g., ferromagnetic, NAND, etc.). Persons skilled in the art will recognize that other forms of non-volatile memory may have analogous memory operations or management functions. Such non-volatile management functions can include wear leveling, garbage collection, fatigue monitoring, reclamation, error detection or correction, block retirement, or one or more other memory management functions. The memory manager 125 may parse or format host commands (e.g., commands received from a host) into device commands (e.g., commands associated with operation of the memory array 120, etc.), or generate device commands (e.g., to accomplish various memory management functions) for the array controller 135 or one or more other components of the memory device 110. Such internally generated operations, such as garbage collection, wear leveling, etc. can result in operations being performed which can provide an opportunity for power management operations as described herein, in the same manner that externally directed memory operations provide.

The memory manager 125 may include a set of management tables 130 configured to maintain various information associated with one or more components of the memory device 110 (e.g., various information associated with a memory array or one or more memory cells coupled to the memory controller 115). For example, the management tables 130 may include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error may be referred to as an uncorrectable bit error. The management tables 130 may maintain a count of correctable or uncorrectable bit errors, among other things. In an example, the management tables 130 may include translation tables or a logical-to-physical (L2P) table or a portion thereof.

The array controller 135 may further include, among other things, circuitry or components configured to control memory operations associated with writing data to, reading data from, or erasing one or more memory cells of the memory device 110 coupled to the memory controller 115. The memory operations may be based on, for example, host commands received from the host 105, or internally generated by the memory manager 125 (e.g., in association with wear leveling, error detection or correction, etc.).

The array controller 135 may further include an error correction code (ECC) component 140, which may include, among other things, an ECC engine or other circuitry configured to detect or correct errors associated with writing data to or reading data from one or more memory cells of the memory device 110 coupled to the memory controller 115. The memory controller 115 may be configured to actively detect and recover from error occurrences (e.g., bit errors, operation errors, etc.) associated with various operations or storage of data based on the ECC data maintained by the array controller 135. This enables the memory controller 115 to maintain integrity of the data transferred between the host 105 and the memory device 110 or maintain integrity of stored data. Part of this integrity maintenance may include removing (e.g., retiring) failing memory resources (e.g., memory cells, memory arrays, pages, blocks, etc.) to prevent future errors.

The memory array 120 may include several memory cells arranged in, for example, devices, planes, sub-blocks, blocks, or pages. As one example, a 48 GB TLC NAND memory device may include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) may include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples may include other numbers or arrangements. In some examples, a memory device, or a portion thereof, may be selectively operated in SLC mode, or in a desired MLC mode (such as TLC, QLC, etc.).

In operation, data is typically written to or read from the non-volatile memory device 110 in pages and erased in blocks. However, one or more memory operations (e.g., read, write, erase, etc.) may be performed on larger or smaller groups of memory cells, as desired. The data transfer size of a non-volatile memory device 110 is typically referred to as a page, whereas the data transfer size of a host is typically referred to as a sector.

In some examples, the memory array may comprise a number of non-volatile memory dies and one or more functions of the memory controller 115 for a particular memory die may be implemented on an on-die controller on that particular die. Other organizations and delineations of control functionality may also be utilized, such as a controller for each die, plane, superblock, block, page, and the like.

Although a page of data may include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 may provide for different page sizes or may require different amounts of metadata associated therewith. For example, different memory device types may have different bit error rates, which may lead to different amounts of metadata necessary to ensure integrity of the page of data (e.g., a memory device with a higher bit error rate may require more bytes of error correction code data than a memory device with a lower bit error rate). As an example, an MLC NAND flash device may have a higher bit error rate than a corresponding SLC NAND flash device. As such, the MLC device may require more metadata bytes for error data than the corresponding SLC device. In certain examples, the memory arrays can include a complete mapping table or L2P table 161.

Figure 2:
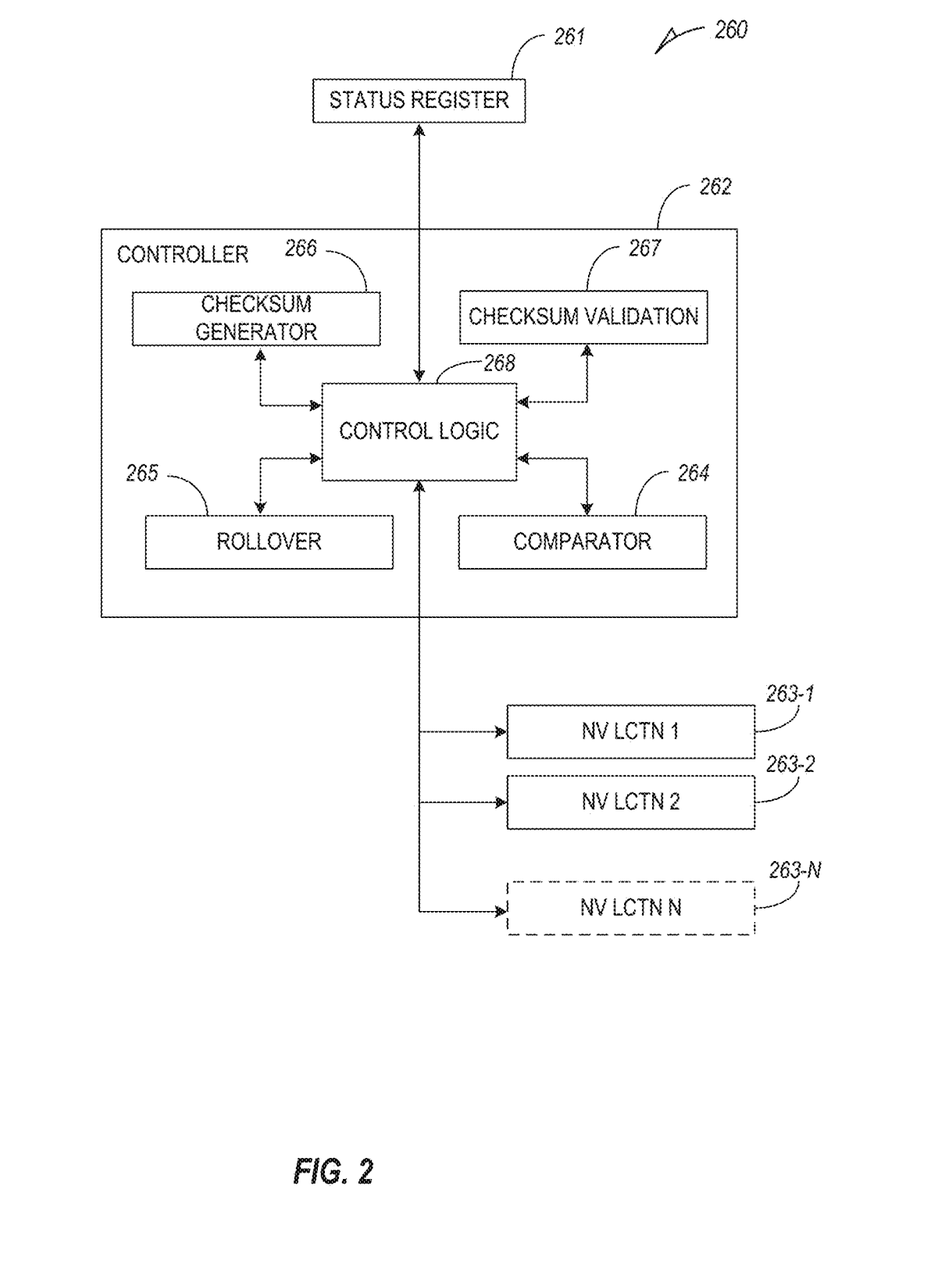
FIG. 2 illustrates an example mechanism for ensuring reliable and accurate refreshment of a system status value after an unexpected power interruption of the system.

FIG. 2 illustrates an example power loss protection mechanism 260 for ensuring reliable and accurate refreshment of a status register 261 after an unexpected power interruption of the overall system. The mechanism 260 can include the status register 261, controller circuitry 262, and two or more non-volatile memory locations 263-1, 263-2, ..., 263-N. The control circuitry 262 can include a comparator 264, rollover evaluation circuit 265, checksum generation circuit 266, a checksum validation circuit 267, and control logic 268. In certain examples, the control circuitry 262 may be part of the non-volatile memory such as part of a memory controller of a non-volatile memory device (e.g., FIG. 1, 161). In some examples, the control circuitry 262 may be in a controller (e.g., FIG. 1, 115) for multiple memory dies (such as managed memory devices and SSDs).

The status register 261 can be a volatile memory location within a larger system, within a non-volatile memory system, or within a non-volatile memory device. In an example, the status register 261 can be a counter, for example, to track a variable of the system or a variable of the non-volatile memory. Such a variable can include a counter for use in wear-leveling, a counter for use in garbage collection, a counter for use in fatigue detection of FeRAM such as a fatigue threshold, or a status register to track progress of a process that, instead of having to restart, can be continued if unexpectedly interrupted due to a power interruption. The non-volatile memory locations 263-1, 263-2, ..., 263-N can be used to store the value of the status register 261 such that upon interruption of power and subsequent start-up, the status register 261 can be refreshed to a last known state before the power interruption. The present inventors have recognized that even when provisions are made to store a value of a status register in non-volatile memory, a power interruption during the process of writing the value to non-volatile memory can corrupt the writing process, thus, negating the benefit of storing the value of the status register. As such, the present subject matter uses multiple non-volatile memory locations 263-1, 263-2, ..., 263-N to better ensure that one of the locations includes a valid, recent value for the status register 261.

The control logic 268 can save the value of the status register 261 to one of the multiple non-volatile memory locations 263-1, 263-2, ..., 263-N and can refresh the value of the status register 261 upon a restart of the system. The control logic 268 can save the value of the status register 261 to a non-volatile location 263-1, 263-2, ..., 263-N whenever the value changes or at regular intervals. The control logic 268 can save the current value of the status register 261 to a different non-volatile location 263-1, 263-2, ..., 263-N than the last time the value of the status register 261 was saved to a non-volatile location 263-1, 263-2, ..., 263-N. This technique ensures that a recent valid value of the status register 261 is saved to non-volatile memory should the current save be interrupted or corrupted, such as by an unexpected power interruption.

Upon a restart of the system, the control logic 268 can evaluate the contents of the multiple non-volatile memory locations 263-1, 263-2, ..., 263-N for the latest value and can refresh the status register 261 with that value. For example, upon a restart of a system using two non-volatile memory locations 263-1, 263-2 and an up-counter as a status register 261, the control circuitry 262 can include a comparator 264 to evaluate the values of the two memory locations 263-1, 263-2 and reset the status register 261 to the higher of the two stored values. If the system allows the counter/status register 261 to roll over, the control circuitry 262 can include a rollover evaluation circuit 265 and the control logic 268 can initiate the rollover evaluation circuit 265 to evaluate the values of the two non-volatile locations 263-1, 263-2 based on a specific roll-over value and can refresh the counter/status register 261 with the later-occurring value. In some examples that use a counter as a status register 261, after refreshing the accumulated count of the counter/status register 261, the control logic 268 may increment the counter/status register 261.

The check generator circuit 266 can compute a checksum for the value of the status register 261 when the value of the status register 261 is saved to one of the non-volatile locations 263-1, 263-2, ..., 263-N. The checksum can be saved with the value of the status register 261. Upon a restart, the checksum can serve to indicate the validity of the value stored at each of the non-volatile memory locations 263-1, 263-2, ..., 263-N. For example, upon the restart, the control logic 268 can initiate the checksum validation circuit 267 to separately compute a checksum for the value assumed to have been saved in a non-volatile memory location 263 to provide a retrieved checksum. The checksum validation circuit 267 can then compare the retrieved checksum to the checksum assumed to be stored at the non-volatile memory location 263. If the checksums match, the checksum validation circuit 267 can indicate to the control logic 268 that the value stored at that non-volatile memory location 263 is valid. If the checksums do not match, the checksum validation circuit 267 can indicate to the control logic 268 that the value stored at that non-volatile memory location 263 is invalid. An invalid checksum result can indicate that the value stored at that non-volatile memory location 263 was corrupted when the value was being written to the non-volatile memory location 263.

Therefore, upon startup of the system, the value of each non-volatile memory location 263-1, 263-2, ..., 263-N and the corresponding stored checksum can be received by the checksum validation circuit 267. A new checksum can be computed for each value by the checksum validation circuit 267. The new checksum can be compared to the stored checksum and the checksum validation circuit 267 can provide the control logic 268 of the control circuitry 262 with an indication of validity for each non-volatile memory location 263-1, 263-2, ..., 263-N. The rollover evaluation circuit 265 of the controller circuitry 262 can also receive the value of each non-volatile memory location 263-1, 263-2, ..., 263-N and can pass roll over information for each non-volatile memory location 263-1, 263-2, ..., 263-N to the control logic 268. The control logic 268 of the controller circuitry 262 can receive the validity information and the rollover information and can pass a reset value to the status register 261.

If only a single location of the multiple non-volatile memory locations 263-1, 263-2, ..., 263-N includes a value and a checksum that indicates the value is valid, the control logic 268 can refresh the status register 261 with that valid value. In certain examples, such as when the status register 261 is a counter, the control logic 268 may increment the valid value and refresh the status register 261 with the incremented value. If the valid value is at a rollover value, the control logic 268 may refresh the status register with the rolled-over value.

If more than one of the non-volatile locations 263-1, 263-2, ..., 263-N include valid values (e.g., values that have a proper corresponding checksum), the values can be compensated based on rollover, the rollover compensated values can be compared to determine the last occurring valid value, and the control logic 268 can refresh the status register 261 with the last occurring valid value. In certain examples, such as when the status register 261 is a counter, the control logic 268 may increment the last occurring valid value and refresh the status register 261 with the incremented value.

If none of the non-volatile memory locations can be verified as valid, the control logic 268 can refresh the status register 261 with a predetermined default refresh value.

Figure 3:
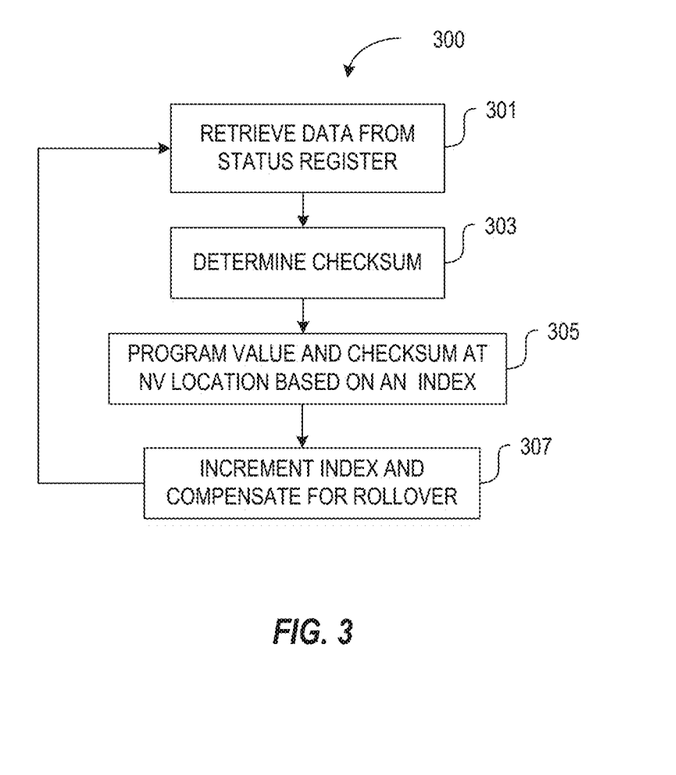
FIG. 3 illustrates generally an example method 300 of saving a state of a status register according to the present subject matter.

FIG. 3 illustrates generally an example method 300 of saving state of a status register according to the present subject matter. At 301, the value of the status register can be retrieved or read. At 303, a checksum of the value of the status register can be determined. At 305, the value of the register and the checksum can be stored or programmed to a non-volatile memory location determined by an index or pointer. In certain examples, the index or pointer can be initiated on startup of the system. At 307, the index can be incremented and, if need be, compensated for rollover. In certain examples, the at least two non-volatile memory locations are used to save the state of the status register. The method 300 can continue to repeat starting at 301. The method ensures that the state of the status register is saved in more than one nonvolatile memory location. Such a method can allow efficient recovery from a power interruption even if the power interruption occurred during the programming of the non-volatile memory and corrupted the saved data. Upon power-up, the last valid status saved can be verified by the checksum and the status register can be refreshed with the validated data. Restarting the system may include redoing one step of the process that was in process at the time of the power interruption. If the status register is a counter, the refresh process can increment the last valid accumulated count to possibly avoid redoing a previously completed task. In some examples, the method may not retrieve the next state of the status register until the state of the status register changes to a state different than the state last saved.

Figure 4:
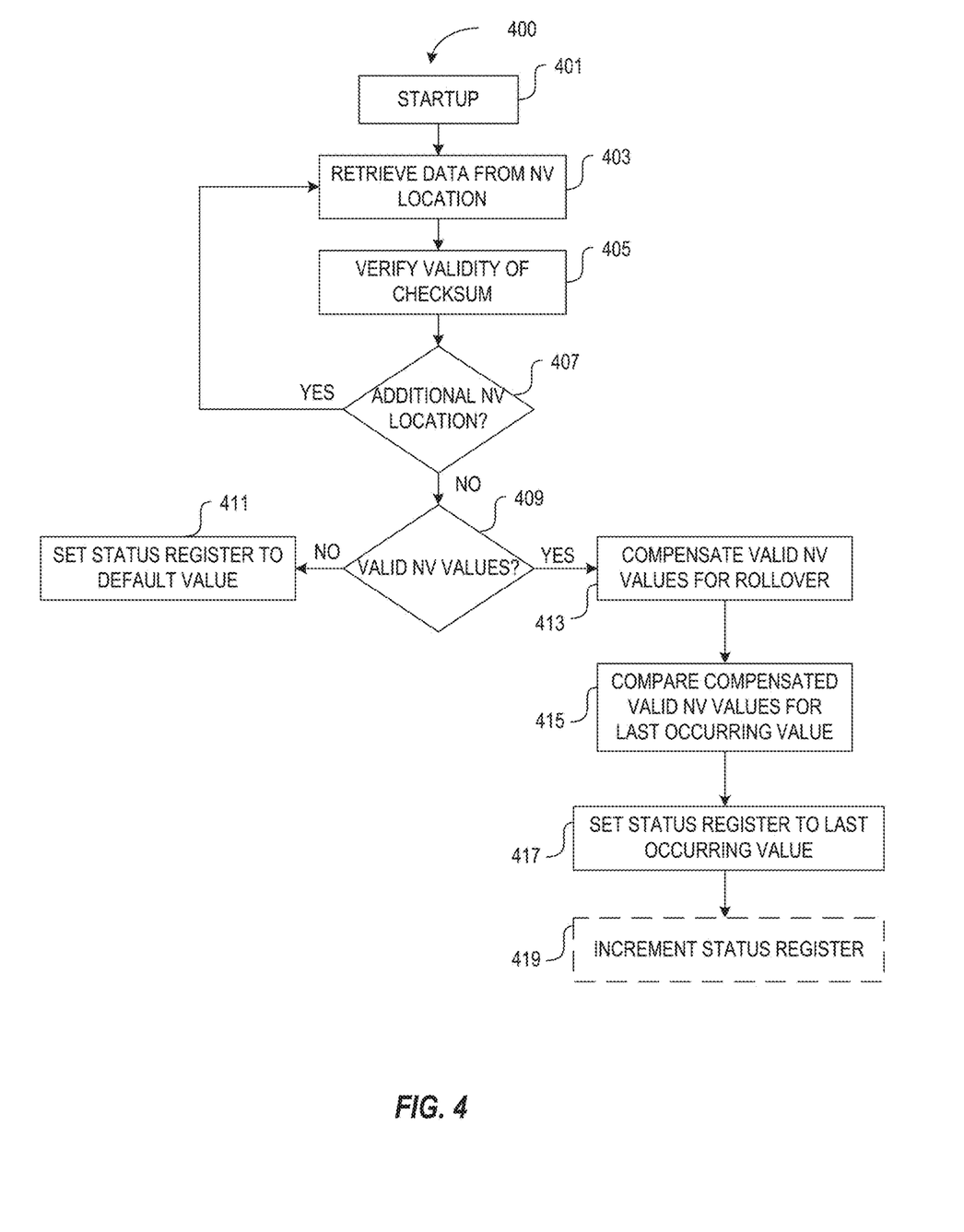
FIG. 4 illustrates generally an example method of restarting a system including the status register discussed above with respect to FIGS. 1-3.

FIG. 4 illustrates generally an example method of restarting a system including the status register discussed above with respect to FIGS. 1-3. At 401, the system including the status register can be restarted. At 403, data from a non-volatile memory location can be retrieved. The non-volatile memory location can be one of at least two or more non-volatile memory locations used to store a state of the status register as discussed with regard to the examples of FIGS. 1-3. At 405, a checksum of a value sensed from a first nonvolatile memory location can be verified as valid or invalid. In certain examples, verification can include calculating a new checksum based on a value within the data received from the non-volatile memory location and comparing the new checksum with a checksum of the data received from the non-volatile memory location. If the checksums match, the value is valid. If the checksums do not match, the value is invalid. At 407, one or more additional non-volatile memory locations can be examined for valid values of the status register. At 409, a determination can be made whether any of the non-volatile memory locations include a valid status register value. If all the values of all the pertinent non-volatile memory locations are invalid, at 411, the value of the status register can be set to a default value.

If one or more values of the pertinent non-volatile memory locations are determined to be valid, at 413, if need be, each valid value can be compensated for rollover. For example, if the status register is an up-counter and the up-counter rolls over to zero at a specified accumulated count, a valid value of zero may actually represent the specified accumulated count. The rollover compensation can track rollover values for purposes of determining which of the valid values represents the last occurring state of the status register. At 415, the valid values including valid values compensated for rollover, can be compared to determine which valid value represents the last known or last occurring state of the status register. For example, lithe status register is an up-counter, the last value of the last occurring state can be the highest rollover compensated value. In some examples, the last occurring value may be determined by comparing the rollover compensated values to a look-up table indicative of the sequence of the status register values.

At 417, the status register can be set to the value represented by the last occurring value determined at 417. In certain examples, the last occurring value may be uncompensated for rollover before being written to the status register. At 419, the status register can optionally be incremented to the next sequence value. Incrementing the status register may be done on systems where one of the values of the pertinent non-volatile memory locations is corrupted or invalid. Such a corruption can indicate that the power interruption occurred when the next state of the status register was being programmed to the non-volatile memory location.

Figure 5:
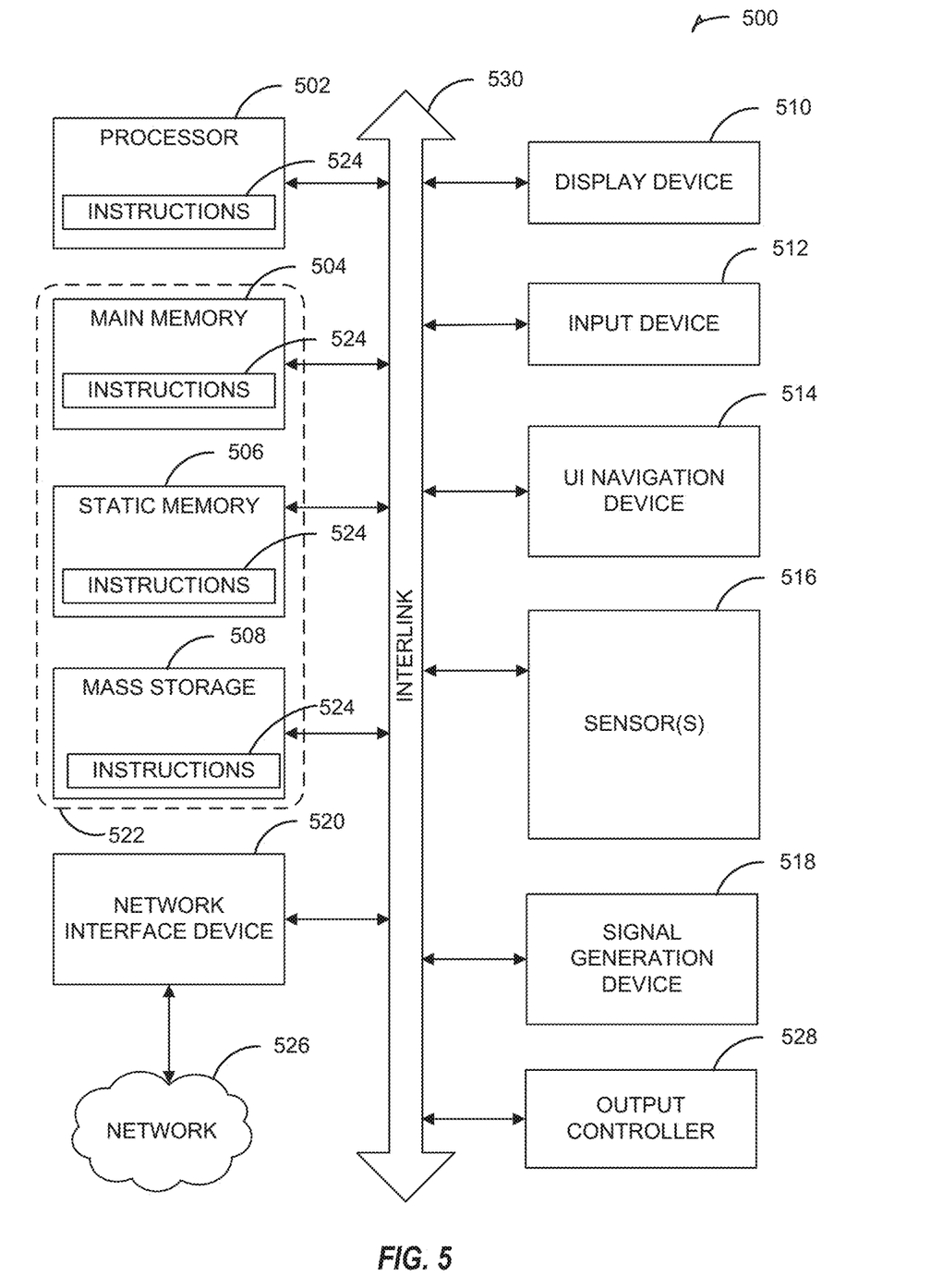
FIG. 5 illustrates a block diagram of an example machine 500 upon which any one or more of the techniques (e.g., methodologies) discussed herein can perform.

FIG. 5 illustrates a block diagram of an example machine 500 upon which any one or more of the techniques (e.g., methodologies) discussed herein can perform. For example, any of the memory systems within machine 500 (main memory 504, static memory 506, and mass storage 521) may implement improved memory access command execution as discussed relative to FIGS. 1-4 herein. In alternative embodiments, the machine 500 can operate as a standalone device or can be connected (e.g., networked) to other machines. In a networked deployment, the machine 500 can operate in the capacity of a server machine, a client machine, or both in server-client network environments. In an example, the machine 500 can act as a peer machine in peer-to-peer (P2P) (or other distributed) network environment. The machine 500 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, movable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) can include a hardware processor 502 (e.g., a central processing unit (CPU), a graphics processing unit (GPU), a hardware processor core, or any combination thereof, such as the memory controller 115, etc.), a main memory 504 and a static memory 506, some or all of which can communicate with each other via an interlink (e.g., bus) 530. The machine 500 can further include a display unit 510, an alphanumeric input device 512 (e.g., a keyboard), and a user interface (UI) navigation device 514 (e.g., a mouse). In an example, the display unit 510, input device 512 and UI navigation device 514 can be a touch screen display. The machine 500 can additionally include a mass storage device (e.g., drive unit) 508, a signal generation device 518 (e.g., a speaker), a network interface device 520, and one or more sensors 516, such as a global positioning system (GPS) sensor, compass, accelerometer, or other sensor. The machine 500 can include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The mass storage device 508 can include a machine readable medium 522 on which is stored one or more sets of data structures or instructions 524 (e.g., software) embodying or utilized by any one or more of the techniques or functions described herein. The instructions 524 can also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 508 can constitute the machine readable medium 522.

While the machine readable medium 522 is illustrated as a single medium, the term "machine readable medium" can include a single medium or multiple media (e.g., a centralized or distributed database, or associated caches and servers) configured to store the one or more instructions 524.

The term "machine readable medium" can include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage 521 device is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging takes place in the compressed block until it is necessary to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 can further be transmitted or received over a communications network 526 using a transmission medium via the network interface device 520 utilizing any one of a number of transfer protocols (e.g., frame relay, Internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 can include one or more physical jacks (e.g., Ethernet, coaxial, or phone jacks) or one or more antennas to connect to the communications network 526. In an example, the network interface device 520 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

Additional Examples

In a first Example, Example 1, a system can include a status register configured to change values to track progression of a process of the system; a first location within a non-volatile memory; a second location within the non-volatile memory; and a controller configured to perform operation comprising, save representations of the values of the status register within the first location or the second location, including, in response to a first value change of the status register, save a first representation of a first value of the status register in the first location, and, in response to a second value change of the status register, save a second representation of a second value of the status register in the second location.

In Example 2, the subject matter of Example 1 includes, wherein the controller is configured to restore the status register with a value of the first location or a value of the second location in response to a startup of the system.

In Example 3, the subject matter of Examples 1-2 includes, wherein the first representation includes a first checksum based on the first value of the status register.

In Example 4, the subject matter of Examples 1-3 includes, wherein the second representation includes a second checksum based on the second value of the status register.

In Example 5, the subject matter of Examples 1-4 includes, wherein, in response to a startup of the system, the controller is configured to determine whether a third representation within the first location includes a first valid value of the status register based on a third checksum within the third representation.

In Example 6, the subject matter of Example 5 includes, wherein, in response to a startup of the system, the controller is configured to determine whether a fourth representation within the second location includes a second valid value of the status register based on a fourth checksum within the fourth representation.

In Example 7, the subject matter of Example 6 includes, wherein, in response to a determination the third representation and the fourth representation include valid values of the status register, the controller is configured to determine whether the third representation or the fourth representation is a most recently saved representation of the status register and restore the status register with a value corresponding to the most recently saved representation.

In Example 8, the subject matter of Examples 6-7 includes, wherein, in response to a determination only one of the third representation or the fourth representation includes a valid value of the status register, the controller is configured to restore the status register with a value corresponding to an immediately sequential valid value based on the valid value.

In Example 9, the subject matter of Examples 6-8 includes, wherein, in response to a determination neither the third representation nor the fourth representation includes a valid value of the status register, the controller is configured to restore the status register with a value corresponding to predetermined default value.

In Example 10, the subject matter of Examples 1-9 includes, wherein the status register is an accumulation register of a counter.

In Example 11, the subject matter of Example 10 includes, wherein the accumulation counter tracks characteristics of the non-volatile memory.

In Example 12, the subject matter of Examples 10-11 includes, wherein the accumulation counter tracks a wear leveling statistic of nonvolatile memory including the first location and the second location.

In Example 13, the subject matter of Examples 1-12 includes, wherein the non-volatile memory includes ferroelectric random access memory (FeRAM).

Example 14 is a method comprising: incrementing a register of a system based on events of a first event type; copying a value of the register to a first non-volatile memory location in response to a first event of the first event type; copying a value of the register to a second non-volatile memory location in response to a second event of the first event type; interrupting power to the system; upon restarting the system, determining a validity of a value the first non-volatile memory location and a validity of a value of the second non-volatile memory locations; and resetting the value of the register based on the validity of the values of the first and second non-volatile memory locations.

In Example 15, the subject matter of Example 14 includes, wherein the copying the value of the register to the first non-volatile memory location includes determining a first checksum based on the value.

In Example 16, the subject matter of Example 15 includes, wherein the copying the value of the register to the first non-volatile memory location includes storing the first checksum in non-volatile memory.

In Example 17, the subject matter of Examples 15-16 includes, wherein the copying the value of the register to the first non-volatile memory location includes storing the first checksum in first non-volatile memory location with the value.

In Example 18, the subject matter of Examples 15-17 includes, wherein the, determining a validity of a value the first non-volatile memory location includes determining a second checksum based on the value of the first non-volatile memory location and comparing the second checksum to the first checksum.

In Example 19, the subject matter of Example 18 includes, wherein the value of the first non-volatile memory location is determined valid in response to the second checksum matching the first checksum.

In Example 20, the subject matter of Examples 14-19 includes, wherein the determining the validity includes: determining whether the value of the first non-volatile memory is valid based on a first checksum, and determining whether the value of the second non-volatile memory is valid based on a second checksum; and wherein the resetting includes resetting the value of the register with a later occurring incremental value of the register of the system, wherein the later occurring value is the value of the first non-volatile memory location or the value of the second non-volatile memory location.

In Example 21, the subject matter of Examples 14-20 includes, wherein the determining the validity includes: determining the value of the first non-volatile memory is valid based on a first checksum, and determining the value of the second non-volatile memory is invalid based on a second checksum; and wherein the resetting includes resetting the value of the register with the value the first non-volatile memory location.

In Example 22, the subject matter of Examples 14-21 includes, wherein the determining the validity includes: determining the value of the first non-volatile memory is invalid based on a first checksum, and determining the value of the second non-volatile memory is invalid based on a second checksum; and wherein the resetting includes resetting the value of the register with a default value.

In Example 23, the subject matter of Examples 14-22 includes, wherein the register of the system is a fatigue threshold register for a non-volatile memory device including the first non-volatile memory location and the second non-volatile memory location.

In Example 24, the subject matter of Examples 14-23 includes, wherein one of the first non-volatile memory location or the second non-volatile memory location is a ferroelectric random access memory (FeRAM) location.

Example 25 is at least one machine-readable medium including instructions that, when executed by processing circuitry, cause the processing circuitry to perform operations to implement of any of Examples 1-24.

Example 26 is an apparatus comprising means to implement of any of Examples 1-24.

Example 27 is a system to implement of any of Examples 1-24.

Example 28 is a method to implement of any of Examples 1-24.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure can be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but can instead be generally perpendicular to the surface of the substrate, and can form an acute angle with the surface of the substrate (e.g., between 60 and 120 degrees, etc.).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
   a hardware status register configured to change values to track progression of a process of the system;
   a non-volatile memory, including first and second locations;
   and
   a hardware controller configured to perform operations comprising:
   saving representations of the values of the status register within the first location or the second location, including:
      in response to a first value change of the status register, saving a first value of the status register in the first location including determining a first checksum based upon the first value;
      in response to a second value change of the status register, saving a second value of the status register in the second location; and
   wherein, in response to a startup of the system:
      determining a validity of a value of the first non-volatile memory location and a validity of a value of the second non-volatile memory location, wherein determining a validity of a value the first non-volatile memory location includes determining a second checksum based on the value of the first non-volatile memory location and comparing the second checksum to the first checksum; and
      resetting the value of the register based on the validity of the values of the first and second non-volatile memory location.

2. The system of claim 1, further comprising saving a third checksum based on the second value of the status register.

3. The system of claim 2, wherein, in response to a startup of the system, the controller is configured to determine the validity of a value of the second non-volatile memory location by determining a fourth checksum based on the value of the second non-volatile memory location and comparing the third checksum to the fourth checksum.

4. The system of claim 3, wherein, in response to a determination that the value of the first non-volatile memory location and the value of the second non-volatile memory location include valid values of the status register, the controller is configured to determine whether the first non-volatile memory location or the second non-volatile memory location is a most recently saved value of the status register and the operations of resetting the value of the register comprises restoring the status register with a value corresponding to a most recently saved representation.

5. The system of claim 3, wherein, in response to a determination that only one of the first non-volatile memory location or second non-volatile memory location includes a valid value of the status register, the controller is configured to resetting the value of the register by restoring the status register with a value corresponding to an immediately sequential valid value based on the valid value.

6. The system of claim 3, wherein, in response to a determination that neither the first non-volatile memory location nor the second non-volatile memory location includes a valid value of the status register, the controller is configured to resetting the value of the register by restoring the status register with a value corresponding to predetermined default value.

7. The system of claim 1, wherein the status register is an accumulation register of a counter.

8. The system of claim 7, wherein the accumulation register tracks characteristics of the non-volatile memory.

9. The system of claim 7, wherein the accumulation register tracks a wear leveling statistic of nonvolatile memory including the first location and the second location.

10. The system of claim 1, wherein the non-volatile memory includes ferroelectric random access memory (Fe-RAM).

11. A method comprising:
at a hardware controller of a computing system:
incrementing a hardware status register of the computing system based on events of a first event type;
copying a value of the register to a first location of a non-volatile memory in response to a first event of the first event type including, determining a first checksum based on the value;
copying a value of the register to a second location of the non-volatile memory in response to a second event of the first event type;
upon re-starting the computing system from a power interruption, determining a validity of a value the first non-volatile memory location and a validity of a value of the second non-volatile memory location, wherein determining a validity of a value the first non-volatile memory location includes determining a second checksum based on the value of the first non-volatile memory location and comparing the second checksum to the first checksum; and
resetting the value of the register based on the validity of the values of the first and second non-volatile memory locations.

12. The method of claim 11, wherein the copying the value of the register to the first non-volatile memory location includes storing the first checksum in non-volatile memory.

13. The method of claim 11, wherein the copying the value of the register to the first non-volatile memory location includes storing the first checksum in first non-volatile memory location with the value.

14. The method of claim 11, wherein the value of the first non-volatile memory location is determined valid in response to the second checksum matching the first checksum.

15. The method of claim 11, wherein the determining the validity includes:
determining whether a value of the second non-volatile memory is valid based on a third checksum; and
wherein the resetting includes resetting the value of the register with a later occurring incremental value of the register of the system, wherein the later occurring value is the value of the first non-volatile memory location or the value of the second non-volatile memory location.

16. The method of claim 11, wherein the determining the validity includes:
determining a value of the first non-volatile memory is valid based on the second checksum matching the first checksum, and
determining the value of the second non-volatile memory is invalid based on a third checksum; and
wherein the resetting includes resetting the value of the register with the value of the first non-volatile memory location.

17. The method of claim 11, wherein the determining the validity includes:
determining the value of the first non-volatile memory is invalid based on the second checksum not matching the first checksum, and
determining the value of the second non-volatile memory is invalid based on a third checksum; and
wherein the resetting includes resetting the value of the register with a default value.

18. The method of claim 11, wherein the register of the system is a fatigue threshold register for a non-volatile memory device including the first non-volatile memory location and the second non-volatile memory location.

19. The method of claim 11, wherein one of the first non-volatile memory location or the second non-volatile memory location is a ferroelectric random access memory (FeRAM) location.

* * * * *